United States Patent [19]
Leigh et al.

[11] Patent Number: 5,153,515
[45] Date of Patent: Oct. 6, 1992

[54] METHODS OF GENERATING PULSES FOR SELECTIVELY EXCITING FREQUENCIES

[75] Inventors: John S. Leigh, Philadelphia; Meir Shinnar, Bala Cynwyd, both of Pa.

[73] Assignee: Trustees of the University of Penna., Philadelphia, Pa.

[21] Appl. No.: 655,077

[22] Filed: Feb. 14, 1991

Related U.S. Application Data

[63] Continuation-in-part of Ser. No. 471,707, Jan. 29, 1990, abandoned, which is a continuation of Ser. No. 176,429, Apr. 1, 1988, abandoned.

[51] Int. Cl.$^5$ .................................. G01R 33/20
[52] U.S. Cl. ................................................. 324/307
[58] Field of Search ................. 363/129; 307/645; 324/300, 307, 309, 310, 311, 312, 313, 314

[56] References Cited

U.S. PATENT DOCUMENTS

| | | | |
|---|---|---|---|
| 3,810,001 | 5/1974 | Ernst | 324/314 |
| 4,173,722 | 11/1979 | Detering | 307/645 |
| 4,630,188 | 12/1986 | Daggett | 363/129 |
| 4,695,798 | 9/1987 | Brandes | 324/307 |
| 4,701,708 | 10/1987 | Hardy et al. | 324/311 |
| 4,766,380 | 8/1988 | Den Boef et al. | 324/309 |
| 4,780,673 | 10/1988 | Hill | 324/307 |
| 4,789,831 | 12/1988 | Mayo, Jr. | 324/309 |
| 4,876,507 | 10/1989 | Van Vaals | 324/307 |

OTHER PUBLICATIONS

I. V. Aleksandrov, *The Theory of Nuclear Magnetic Resonance*, pp. 169–181, Academic Press, NY, 1966 (Textbook).

S. M. Eleff et al., "The Synthesis of Pulse Sequences Yielding Arbitrary Magnetization Vectors", *Journal of Magnetic Resonance in Medicine*, vol. 12, pp. 74–80 (1989).

P. J. Hore, "Solvent Suppression in Fourier Transform Nuclear Magnetic Resonance", *Journal of Magnetic Resonance*, vol. 55, pp. 283–300 (1983).

L. D. Landau and E. M. Lifschitz, *Quantum Mechanics:*

*Primary Examiner*—Michael J. Tokar
*Attorney, Agent, or Firm*—Woodcock Washburn Kurtz Mackiewicz & Norris (List continued on next page.)

[57] ABSTRACT

Methods of constructing pulse sequences to selectively excite frequency bands in NMR imaging, spectroscopic and optical systems are disclosed. In preferred embodiments, selective $\pi/2$, $\pi$, and refocusing hard and soft pulses are constructed for perturbing the spins of the system. In NMR imaging, for example, the desired magnetization is written as an $(N+1)$th order Fourier series in $\omega t$, where $\omega$ is the off-resonance frequency. In addition, if all pulses have the same phase, then the z magnetization is known to be symmetric in frequency, and the resulting hard pulse sequence can be written as an Nth order Fourier cosine series. Given this Fourier series representing the desired z magnetization, an inversion may be used to determine the hard pulse sequence of N pulses which will actually yield the desired response. In particular, if one starts with a specification of a desired z magnetization not as a Fourier series in $\omega t$, but rather as having certain desired values over several frequency ranges, the techniques of finite impulse response filters may be applied to yield the desired Fourier series representing the z and xy magnetizations. The optimal hard pulse sequence which yields that Fourier series may then be mathematically determined and applied to the system to yield the desired response. In accordance with another feature of the invention, the synthesized hard pulse sequence may be used to generate a soft pulse which has a frequency response over a broad range which is the same as that of the synthesized hard pulse sequence. The methods of the invention thus allow for the generation of optimal pulse sequences without the use of linear Fourier transform approximations to intrinsically nonlinear systems.

22 Claims, 3 Drawing Sheets

OTHER PUBLICATIONS

*Non Relativistic Theory*, pp. 188–196, Pergamon Press, London, 1965 (Textbook).

A. V. Oppenheim & R. W. Schaefer, *Digital Signal Processing*, pp. 237–267, Prentice Hall, New Jersey, 1975 (Textbook).

M. Shinnar and J. S. Leigh, "Frequency Response of Soft Pulses", *Journal of Magnetic Resonance*, vol. 75, pp. 502–505 (1987).

M. Shinnar and J. S. Leigh, "The Application of Spinors to Pulse Synthesis and Analysis", *Journal of Magnetic Resonance in Medicine*, vol. 12, pp. 93–98 (1989).

M. Shinnar et al., "The Use of Finite Impulse Response Filters in Pulse Design", *Journal of Magnetic Resonance in Medicine*, vol. 12, pp. 81–87 (1989).

M. Shinnar et al., "The Synthesis of Pulse Sequences Yielding Arbitrary Symmetric Magnetization Vectors", in *Journal of Magnetic Resonance*, vol. 72, pp. 298–306.

M. Shinnar et al., "The Synthesis of Soft Pulses with a Specified Frequency Response", *Journal of Magnetic Resonance in Medicine*, vol. 12, pp. 88–92 (1989).

M. S. Silver et al., "Highly Selective $\pi/2$ and $\pi$ Pulse Generation", *Journal of Magnetic Resonance*, vol. 59, pp. 347–351 (1984).

V. H. Subramanian et al., "An Exact Synthesis Procedure for Frequency Selective Pulses", in *5th Proceedings of the Magnetic Resonance in Medicine*, pp. 1452–1453, Aug., 1986.

H. Yan and J. C. Gore, "Improved Selective 180° Radiofrequency Pulses for Magnetization Inversion and Phase Reversal", *Journal of Magnetic Resonance*, vol. 71, pp. 116–131 (1987).

METHODS OF GENERATING PULSES FOR SELECTIVELY EXCITING FREQUENCIES

CROSS-REFERENCE TO RELATED APPLICATIONS

This application is a continuation-in-part application of U.S. Patent Application Ser. No. 07/471,707, filed Jan. 29, 1990, now abandoned, which is a continuation application of U.S. Patent Application Serial No. 07/176,429, filed Apr. 1, 1988, now abandoned.

FIELD OF THE INVENTION

This invention relates to novel methods for selectively exciting specified frequencies of magnetic systems. More specifically, this invention relates to methods of synthesizing pulse sequences which generate an arbitrary, frequency dependent excitation in nuclear magnetic resonance (NMR) systems.

BACKGROUND OF THE INVENTION

Nuclear magnetic resonance (NMR) has many applications in chemistry and biology. Recent advances have made it possible to use NMR to image the human body. Because much of the body is water, which gives an excellent NMR signal, NMR can yield detailed images of the body and information about various disease processes.

The physical basis of NMR is that many nuclei, such as protons, have a magnetic spin. When an external field, $B_0$, is applied to a system whose elements have a magnetic spin, the individual elements of the system process around $B_0$ according to the Larmor frequency. The Larmor frequency, for typical values of the external field $B_0$ and for typical nuclei being investigated, is in the radio frequency (rf) range.

Generally, in NMR the system is perturbed by an alternating signal at or near the Larmor frequency of the spins of interest, whose magnetic field ($B_1$) is normal to $B_0$. This signal is called by those skilled in the art a pulse. It will perturb the spins which have a Larmor frequency at or near the frequency of the signal. The stronger the $B_1$ field, the broader range of frequencies that it will perturb. The longer the B field is on, and the stronger the $B_1$ filed is, the more the spins will be perturbed.

NMR imaging schemes depend on applying magnetic field gradients so that different nuclei at different locations experience different magnetic fields and, therefore, have different frequencies. Accordingly, the location of the nucleus determines its frequency One then applies a pulse, which rotates, or excites, the nuclei, and therefore, the magnetic dipole moment One tries to excite only nuclei which have frequencies corresponding to the slice of tissue which it is desired to image, and to excite those nuclei to the same degree.

Thus, it is necessary to design pulses which perturb a particular range of frequencies to the same extent but that do not perturb all other frequencies. This "ideal" pulse is physically unrealizable However, it has been possible to synthesize pulses which will do this more or less perfectly. As a result, much work in the NMR imaging art has gone into synthesizing pulses which will give very "sharp" slices, for the sharper the slice, the better the resolution of the image.

The type of "excitation" of the system may differ from one application to another. Excitation may be thought of as a rotation around some axis. In some applications, one wishes to rotate some frequencies 90° around an axis in the xy plane using a $\pi/2$ pulse, 180° around an axis in the xy plane using a $\pi$ pulse or inversion, and rotating all the desired frequencies 180° degrees around the same axis in the xy plane using a selective refocusing pulse.

The problems of frequency selective excitation, as described above, also arises in other contexts. In many chemical applications of NMR (spectroscopy), for example, it is desired to obtain information about a chemical which is present in solution. The frequency of the nuclei of the chemical is different than the frequency of the solvent. However, because there is so much more solvent than chemical, if one excites all frequencies, the signal from the chemical will be overwhelmed. Thus, it is desirable to have a scheme where one can selectively excite frequencies which are different from the solvent frequency.

There have been two general approaches to this problem. One approach uses "hard" pulse sequences. A "hard" pulse is known by those skilled in the art to mean a constant amplitude rectangular radio frequency pulse in which the strength of the applied alternating field is sufficiently large that the pulse can be assumed to affect all frequencies of interest equally. Selective excitation is thus achieved by applying several pulses in a row and varying pulse widths and inter-pulse delay times. Different frequencies precess for different amounts during the delays between the pulses and thus respond differently to the pulse sequence. Many pulse sequences using hard pulses have been devised for different applications in NMR imaging, as described by P.J. Hore in an article entitled "Solvent Suppression in Fourier Transform Nuclear Magnetic Resonance", *Journal of Magnetic Resonance*, Vol. 55, pp. 283-300 (1983), for example, and by Brandes in U.S. Pat. No. 4,695,798.

However, hard pulse sequences have several major limitations. First the frequency response of hard pulses have "side lobes" or harmonics around the desired frequency range. The location of the side lobes depends on the delay between pulses. Second, if the frequency range of interest is large, as it is in NMR imaging, it may be difficult to create pulses that are strong enough to be considered "hard". Thus, they have been used primarily for solvent suppression. Furthermore, the frequency response of hard pulse sequences currently in use is far from ideal.

Another general approach has been to use "soft" pulses. A "soft" pulse is known by those skilled in the art to mean a relatively long, low amplitude pulse which is sufficiently weak that different frequencies are excited by different amounts. Because different frequencies respond differently to the same pulse, selective excitation is possible using soft pulses. These pulses also can have varying phase and amplitude and are then sometimes referred to as "shaped" pulses. Thus, when soft pulses are used, the way that different frequencies are selected is fundamentally different than when hard pulse sequences are used.

All clinical NMR imaging machines that the inventors are aware of use "soft" pulses for slice selection for routine imaging, although "hard" pulses may be used in specialized applications. However, the soft pulses currently available are far from ideal The most commonly used is the "sinc" pulse, whose shape is that of the sinc function, $\sin(x)/x$, truncated on both sides. Unfortunately, the frequency response to this pulse is far from ideal. Not only is there a slow transition from excitation to non-excitation, but there are several side lobes of excitation within the region where excitation is not desired. This leads to reduced resolution of the images obtained.

Much work has gone into devising pulses which have better frequency characteristics. One of the best of these is the hyperbolic secant pulse described by M.S. Silver et al. in an article entitled "Highly Selective $\pi/2$ and $\pi$ Pulse Generation", *Journal of Magnetic Resonance*. Vol. 59, pp. 347-351 (1984). Unfortunately, even the response to this pulse does not have an ideal frequency response. Furthermore, implementation of this pulse requires a spectrometer which can simultaneously modulate the amplitude and phase of the applied external field, which many spectrometers cannot do. Indeed, patents have issued on the instrumentation for the delivery of certain shaped pulses to the transmitter, such as the afore-mentioned patent to Brandes.

There have been other continuing efforts to devise improved pulses, as described by, for example, H. Yan and J. Gore in an article entitled "Improved Selective 180° Radiofrequency Pulses for Magnetization Inversion and Phase Reversal", *Journal of Magnetic Resonance*, Vol. 71, pp. 116-131 (1987). However, the relationship between soft and hard pulse sequences has not previously been extensively investigated. To the inventors' knowledge, there has been no previous theoretical or experimental effort using a soft pulse to approximate a hard pulse sequence, or of designing hard pulse sequences in order to design soft pulses.

In addition to the use of selective $\pi/2$ and $\pi$ pulses, one may need a selective refocusing pulse, i.e., a pulse which rotates the desired spins 180° about a fixed axis in the xy plane A normal inversion pulse rotates about an axis in the xy plane and may vary with frequency. Thus, one needs to have ways of analyzing the rotation operator induced by hard pulses. One technique which is known in the NMR literature is the use of spinors, as described, for example, by L.D. Landau and E.M. Lifschitz in *Quantum Mechanics: NonRelativistic Theory*, pp. 188-196, Pergamon Press, London, 1965, and by I.V. Aleksandrov in The *Theory of Nuclear Magnetic Resonance*, pp. 169p14 181, Academic Press, NY 1966. Spinors thus allow for the representation of a hard pulse sequence so as to analyze the rotation operator. However, to the inventors' knowledge, such techniques have not been used by others for analyzing the rotation operator induced by soft pulses.

There is thus a long felt need in the art for methods of creating pulse sequences which selectively excite frequencies in NMR. This need requires construction of hard pulse sequences and soft pulses for specific excitation of the frequency spectrum so as to achieve close to optimal frequency responses. This result has not heretofore been achieved in the NMR imaging art. The present invention achieves this desired result, thereby allowing NMR and other imaging systems to produce highly resolved representations of the samples under examination.

SUMMARY OF THE INVENTION

Methods of constructing pulse sequences to selectively excite frequency bands in NMR imaging and spectroscopy are disclosed. These methods, in preferred embodiments, construct selective ($\pi/2$), and refocusing pulses for perturbing the spins of the system. The resulting pulses may be either soft or hard pulses in accordance with the methods of the invention.

The present invention exploits the following facts about hard pulse sequences. While these facts are generally known to people skilled in the art, their consequences were apparently never understood prior to the present application. Accordingly, to the inventors' knowledge, the following relationships between hard and soft pulses have not heretofore been appreciated.

In accordance with the invention, a sequence of N hard pulses, $P_1$-$P_N$, is selected which satisfies the following conditions:

(1) Each pulse is assumed to be instantaneous, or sufficiently short that its duration can be ignored.

(2) The same amount of time, t, occurs between any two pulses. During this time the magnetization precesses around the z axis with frequency $\omega$.

(3) The total duration of the pulse sequence, Nt, is sufficiently short that relaxation can be ignored.

Then, if it is assumed that the z magnetization, as a function of frequency, started out at equilibrium, with $M_z(\omega) = 1$, then the resultant z magnetization, assuming the system started in equilibrium, can be written as an (N-1)th order Fourier series in $\omega t$, where $\omega$ is the off-resonance frequency Furthermore, if all pulses have the same phase, then the z magnetization is symmetric in frequency ($M_z(\omega) = M_z(-\omega)$), and can be written as an Nth order Fourier cosine series in $\omega t$. This Fourier series is not a Fourier transform of the hard pulse sequence, and the relationship between the pulses and the response is non-linear.

In preferred embodiments, the method of the invention has the following characteristics:

(1) If one is given a Fourier series (in $\omega t$) description of the desired z magnetization of a hard pulse sequence of N pulses, then one can actually do an inversion of this nonlinear problem and determine a hard pulse sequence which will actually yield that desired response.

(2) Furthermore, if one is given a Fourier cosine series, one can generate a series of hard pulses around a fixed axis which gives the desired response.

(3) In general, one starts with a specification of the desired z magnetization not as a Fourier series in $\omega t$, but rather as having certain desired values over several frequency ranges. It was realized by the inventors that the techniques of digital filter design, specifically that of finite impulse response filters, not part of the art of NMR, could be applied to yield the desired Fourier series Because the theory of digital filter design is quite advanced, one can generate Fourier series which optimally give the desired response. One thus can generate hard pulse sequences which have the optimal frequency response.

(4) If a soft pulse is desired, one can use the hard pulse sequences generated by this technique to generate a soft pulse. This soft pulse will have a frequency response over a broad range which is the same as the hard pulse sequence. This frequency response will be optimal, for, as will be shown, any soft pulse can be approximated by a hard pulse sequence. One can thus solve this well known problem in NMR to obtain optimal pulses for any application.

The method of the invention thus provides a technique of synthesizing either a sequence of hard pulses or a soft pulse for generating any desired realizable magnetization. The sequence of hard pulses is generated around a fixed axis which will generate any desired realizable magnetization which is symmetric in frequency. Preferably, the techniques of finite impulse response filters are used for specifying the desired magnetization. In accordance with a preferred embodiment of the invention, the generated hard pulse sequences may be used to generate a soft pulse with a frequency response similar to the hard pulse sequence. In particular, the techniques of finite impulse response filters may be used to specify the frequency response of the hard pulses, which, in turn, are used to synthesize a soft pulse which will generate the desired realizable magnetization.

DETAILED DESCRIPTION OF THE PREFERRED EMBODIMENT

Figure 1:
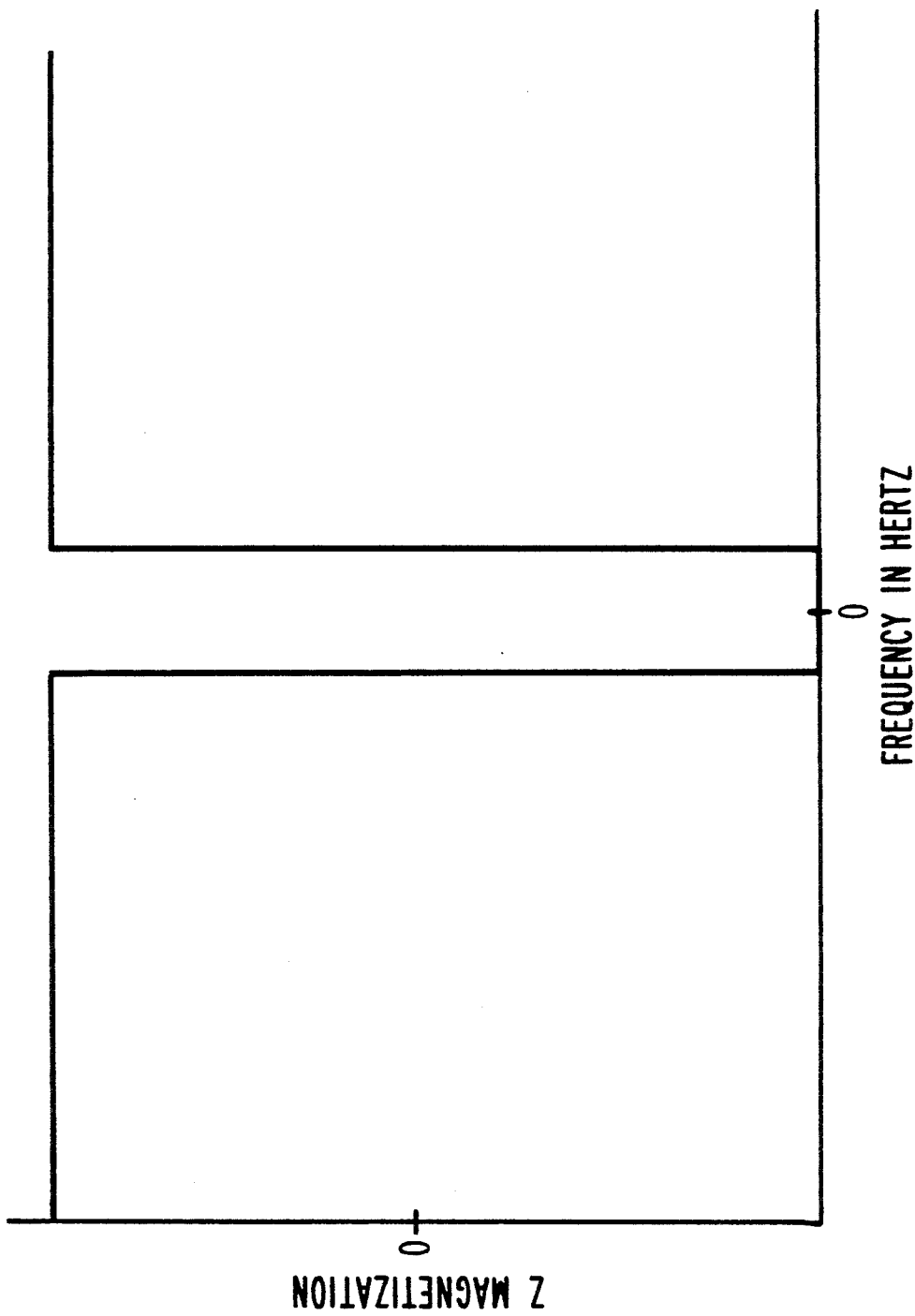
FIG. 1 graphically illustrates the frequency response of an "ideal" pulse sequence plotted as z-magnetization versus frequency.

A method in accordance with presently preferred exemplary embodiments of the invention will be described below with reference to FIGS. 1-3. It will be appreciated by those of ordinary skill in the art that the description given herein with respect to those figures is for exemplary purposes only and is not intended in any way to limit the scope of the invention. All questions regarding the scope of the invention may be resolved by referring to the appended claims.

When a material is placed in an external magnetic field, any magnetic dipoles in the material will interact with that field, and the material is said to become "magnetized". The magnetization of the material can generally be described by a three dimensional vector, the magnetization, M. Since many of the individual nuclei of the material may have a magnetic dipole moment, many materials become magnetized.

In NMR, a large external magnetic field, $B_0$, is applied to the system, and the nuclear magnetic dipoles interact with the field. The magnetization vector of the dipoles spins, or rotates, around the direction of $B_0$ with a characteristic frequency, $\omega_0$, known as the Larmor frequency. This frequency is a function of the applied field $B_0$, the nucleus, and the environment of the nucleus. The direction of $B_0$ will be referred to herein as the z axis.

In order to observe the magnetization, an alternating electromagnetic field, $B_1$, with a frequency $\omega$ is then applied to the system. Typically, the axis of this field is in the xy plane orthogonal to $B_0$. This field is called a pulse. Any spin with a Larmor frequency close to $\omega$ will interact with the applied field and rotate away from the z axis towards the xy plane. This interaction is called excitation of the spins. The precise axis of rotation and amount of rotation depend on the strength of the pulse, the duration of the pulse, and the difference between $\omega$ and $\omega_0$. If $B_1$ is very strong in relation to the off-resonance effects $(\omega - \omega_0)$, then the rotation will be essentially around an axis in the xy plane and is called a hard pulse as previously described.

In a typical experiment, the spins of interest will have different $\omega_0$ values, either because they have a different environment, or because $B_0$ varies with location (a gradient). Furthermore, one needs to have different types of excitation of the spins depending on the experiment. The three most commonly needed types of excitation are described as a $\pi/2$ pulse, which rotates spins from the z axis to the xy plane, a $\pi$ pulse, which rotates spins from pointing in the positive z direction towards the negative z direction, and a refocusing pulse, which rotates spins of interest 180° about an axis in the xy plane, the axis being the same for all spins of interest. However, other types of excitation profiles can be needed, and one may need to apply a different type of excitation to different frequencies.

The response function of a pulse is typically viewed as the response of an ideal system where the magnetization vector for every frequency is one and pointing in the positive z direction. One looks at the resultant magnetization after the pulse along the z axis and in the xy plane as a function of frequency. Thus, if the $M_z$, after a pulse for a frequency $\omega$ is $-1$, one knows that if the pulse is applied to a system which has nuclei with a frequency of $\omega$, after the pulse the magnetization vector associated with those nuclei will be pointing straight up.

It has been of general interest to the NMR imaging community to construct either a sequence of hard pulses or an alternating $B_1$ field which can have alternating phase and amplitude, which will give a desired excitation profile, exciting some frequencies a specified amount and not exciting other frequencies. Such pulses are of interest both for biomedical imaging and for chemical applications. As previously described, much work has gone into the development of such pulses; however, because the relationship between the exciting $B_1$ field and the resultant excitation is nonlinear, it has previously been very difficult to find a $B_1$ profile which will give the desired excitation profile.

Figure 2:
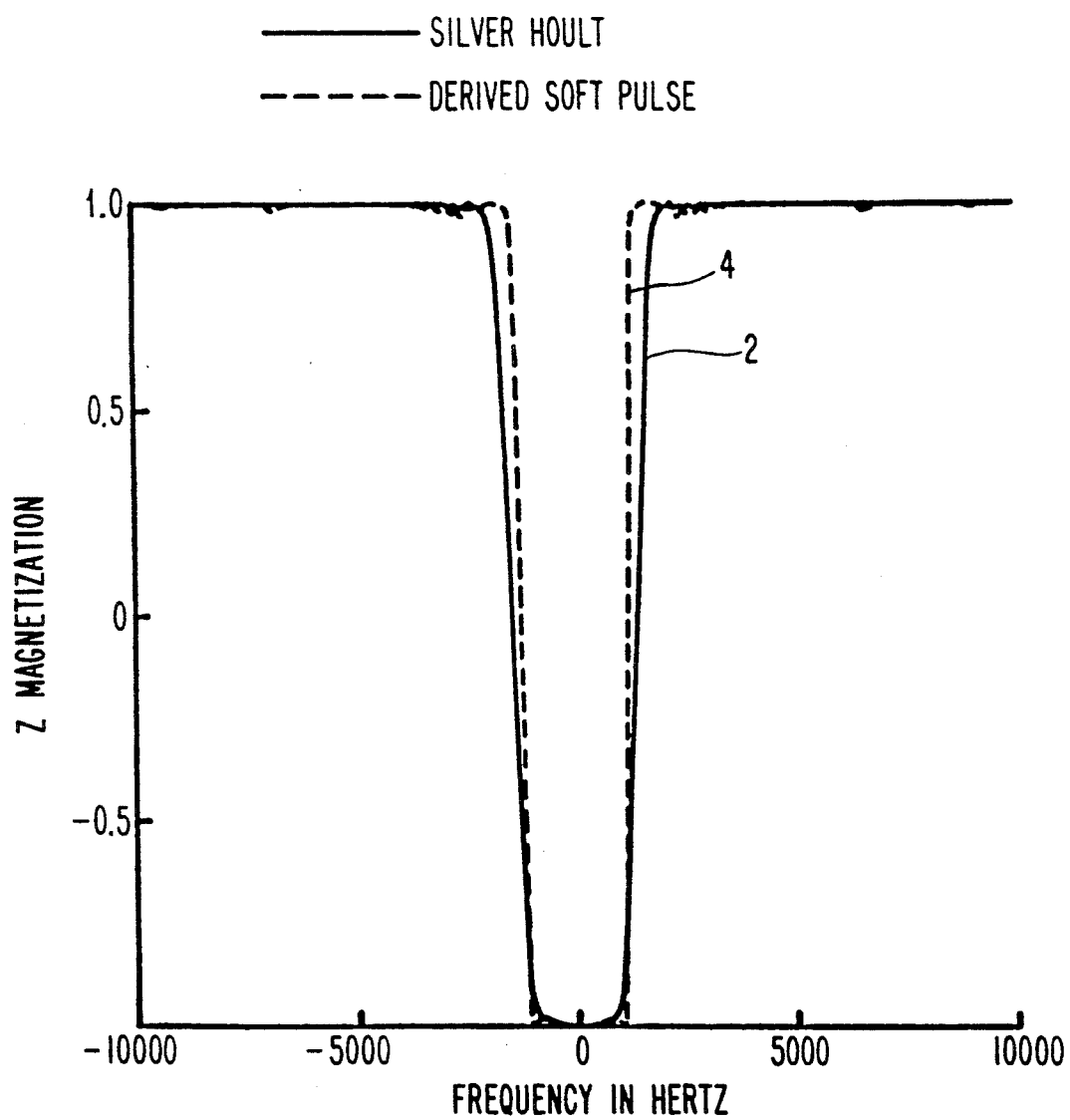
FIG. 2 graphically illustrates a comparison of the Silver et al. hyperbolic secant pulse and a soft pulse derived in accordance with the methods of the invention.

An ideal excitation profile is shown by way of example in FIG. 1. FIG. 1 illustrates the ideal frequency response of the pulse plotted as a function of z magnetization against frequency FIG. 1 is ideal since the pulse is perfectly square. However, it is currently physically impossible to achieve this kind of accuracy because of Heisenberg's uncertainty principle. However, as will be described below, the goal of pulse shaping in accordance with the invention is to approximate the ideal pulse of FIG. 1 as closely as possible.

Accordingly, most of the current NMR imaging systems use pulses which are based on a linear approximation of the relationship between the input pulse and the response of the spins. This approximation assumes a Fourier transform relationship, which is not really valid. This has led to slices whose edges are not as well defined as desired. The present invention has been designed to improve upon this approximation.

The present invention is a technique for obtaining the $B_1$ field which will actually yield a desired excitation profile closely approximating that shown in FIG. 1. If a desired excitation profile is physically realizable, the method of the invention will invert the nonlinear relationship between the input $B_1$ field and excitation to obtain the desired $B_1$ field. Furthermore, if one starts out with a desired excitation profile which is not physically realizable, the method of the invention gives a procedure for a physically realizable profile which is closest to the desired profile, and then finds a $B_1$ which will yield the desired profile. Depending on the implementation, the procedure yields either a hard pulse sequence or a soft pulse. Furthermore, one can specify the components of the desired spinor effect of the pulse rather than just the magnetization.

Practical applications of NMR imaging involve systems with a multiplicity of nuclei having different resonant frequencies $B_0$. By exciting only certain resonant frequencies, a particular part of the human body, for example, may be imaged. Similarly, when the magnetic field gradient $B_1$ is applied, different parts of the human body will exhibit different resonant frequencies in NMR. Therefore, the ability to obtain a highly resolved image is dependent on the ability of the NMR system to distinguish different frequencies. The present invention accomplishes this by constructing tailored hard pulse sequences or soft pulses which excite a narrow bandwidth of resonant frequencies to gain clarity of imaging for better clinical diagnosis. Using the techniques to be described below, hard pulse sequences or soft pulses may be generated so as to achieve frequency responses which are as close to the ideal or optimal pulse as possible. The following represents the mathematical formulation of a hard pulse sequence which will yield arbitrary symmetric magnetization vectors in accordance with the invention.

As described by the present inventors in an article entitled "The Synthesis of Pulse Sequences Yielding Arbitrary Symmetric Magnetization Vectors", in *Journal of Magnetic Resonance*, Vol. 72, pp. 298-306, the first step of the method of the invention is to start with a physically realizable z magnetization which may be achieved by a hard pulse sequence and to determine a hard pulse sequence which will actually yield that z magnetization. In particular, an N hard pulse sequence to be applied around the x axis within a total duration of T has a magnetization response $M_z$ which can be written (as a function of frequency) as a Fourier cosine series:

$$M_z(\omega) = \sum_{j=0}^{N-1} a_j \cos(j\omega T/(N-1)) \qquad \text{Equation (1)}$$

with $|M_z(\omega)|$ always $\leq 1$.

If a specification of a desired $M_z(\omega)$ is given, then we know, since magnetization is preserved by the pulses, that $M^2_x(\omega) + M^2_y(\omega) + M^2_z(\omega) = 1$. The first step of the invention is thus to find an appropriate solution of $M_z$ and $M_y$ which will satisfy this equation. For this purpose, we write $M_{xy}(\omega) = M_y(\omega) - iM_x(\omega)$. The above condition then becomes $|M_{xy}(\omega)|^2 + M^2_z(\omega) = 1$.

This reduces to a phase retrieval or deconvolution problem, well studied in signal analysis, although generally not familiar to those skilled in the NMR art. There are a number of approaches to solving this problem. For example, one can convert $M_z(\omega)$ to a complex polynomial in $s = \exp(i\omega T/(N-1))$ and then solve for the roots of the polynomial $1 - M^2_z(\omega)$, or equivalently for the two polynomials $(1-M_z(\omega), 1+M_z(\omega))$. One then groups the roots of the polynomials by means of symmetry considerations and chooses half of them. There are also techniques such as cepstral deconvolution which allow for the solution of $M_{xy}(\omega)$ as an $(N-1)$ degree polynomial in $s = \exp(i\omega T/(N-1))$. This is a representation of $M_{xy}(\omega)$ as an N-1th degree complex Fourier series One can guarantee that since the polynomial for $M_z$ had real coefficients, the polynomial for $M_{xy}$ will also have real coefficients. The Fourier coefficients may be generated by viewing $M_z$ as a function of $\Omega$, where $\Omega = \omega T/(N-1)$, using a digital fast Fourier transform and looking at the cosine coefficients.

The following are the details of one possible approach to the resulting deconvolution problem:

Letting $\Omega = \omega T/(N-1)$, we first express $|M_{xy}(\Omega)|^2$ as a polynomial in $\cos(\Omega)$. Namely, using Tschebyscheff polynomials, one can write $\cos(n\Omega)$ $T_n(\cos(\Omega))$ as a polynomial in $\cos(\Omega)$. Thus, one can write:

$$M_z(\Omega) = \sum_{j=0}^{N} b_j(\cos(\Omega))^j = Q(\cos(\Omega)). \qquad \text{Equation (2)}$$

We now assume that there is no loss of magnetization during he entire pulse sequence. That is, $N\tau << T_2$ for N pulses with a constant time spacing $\tau$. Then:

$$|M_z(\Omega)|^2 + |M_{xy}(\Omega)|^2 = |M_o|^2, \qquad \text{Equation (3)}$$

where $M_o$ is a constant which may be normalized to 1. We can therefore write $M_{xy}(\Omega) = \text{sqrt}(1 - |M_z(\omega)|^2)e^{i\phi}$, where $\phi$ is the phase relationship we are trying to construct. We shall use this relationship to write $M_{xy}(\Omega)$ as a complex Fourier series Since $M_z(\Omega)$ is real, $|M_z(\Omega)|^2 = (M_z(\Omega))^2$. We can therefore write, for $u = \cos(\Omega)$:

$$P(u) = 1 - Q(u)^2 = 1 - |M_z(\Omega)|^2 = \sum_{j=0}^{2N} b_j u^j = |M_{xy}(\Omega)|^2 \qquad \text{Equation (4)}$$

Viewing P(u) as a polynomial in u, we now factor P(u) to solve for its roots $$P(u) = b_{2N} \prod_{j=1}^{2N} (u - u_j) \qquad \text{Equation (5)}$$

We now define $s = e^\omega$, where $u = (s + s^{-1})/2$. We can therefore define rational function R(s) and give its factorization as follows:

$$R(s) = P((s + s^{-1})/2) = \qquad \text{Equation (6)}$$

$$b_{2N} 2^{-2N} s^{-2N} \prod_{j=1}^{4N} (s - s_j) = 1 - |M_z(\Omega)|^2$$

Next, we group the roots into conjugate pairs noting that $s_j$ is a root of R(s) if and only if $(s_j + s_j^{-1})/2 = u_k$, for some k. Thus, if $s_j$ is a root, $s_h^{-1}$ is a root. Furthermore, because P(u) has real coefficients, if $u_j$ is a root, $u_j^*$ is a root (with * denoting complex conjugate). So if $s_j$ is a root, $S_j^*$ is a root as well. We also note that $|s| = 1$ occurs only when u is real, and $|u| \geq 1$. Since $P(u) = 1 - |M_z(\omega)|^2 \geq 0$ for $\omega = \cos(\omega <)$, thus any root $u_j$ with $u_j$ real and $|u_j| < 1$ must occur with even multiplicity. Therefore, roots $s_j$ can be grouped as follows:

1) $r_j$ real, $|r_j| = 1$ can be grouped into $r_j$, $r_j^{-1}$, j = 1, L.
2) $f_j$ complex, $|f_j| = 1$. Then $f_j$, $f_j^{3^1 \; 1}$, $f_j^{-1*}$ are roots, j$\omega$1, M.
3) $g_j$ real, $|h_j| = 1$. Every $g_j$ oocurs with even multiplicity, $2*K_j$, j = 1, K.
4) $h_j$ complex, $|h_j| = 1$. Again, $h_j$ occurs with even multiplicity, $2*H_j$. Furthermore, if $h_j$ is a root, so is $h_j^* = h_j^{-1}$. Thus, we can group roots into $h_j$, $h_j^{-1}$, with multiplicity $2*H_j$, j = 1, H.

We next need to select a phase function for $M_{xy}(\omega)$. Accordingly, for each set of roots, we choose a representative. Thus, for each set of real roots $a_j$ we choose either $r_j$ of $r_j^{-1}$. For each set of complex roots, $f_j$, we choose a conjugate pair, either $f_j$, $f_j^*$, of $f_j^{-1}$. This gives us $2^{(L+H)}$ choices. Each choice gives us a different phase function for $M_{xy}(\omega)$.

Using our choices in the previous step, we now define the following rational function to define $M_{xy}(\omega)$:

$$G(s) = As^{-N} \left( \prod_{j=1}^{L} (s - r_j) \prod_{j=1}^{M} (s - f_j)(s - f_j^*) \right) \times$$

$$\left( \prod_{j=1}^{K} (s - g_j)K_j \prod_{j=1}^{H} (s - h_j)(s - h_j^{-1}) \right). \quad \text{Equation (7)}$$

with $$A^2 = b_2 N^{2-2N} / \left( \prod_{j=1}^{L} (r_j) \prod_{j=1}^{H} (f_j f_j^*) \prod_{j=1}^{K} (h_j) K_j \right) \quad \text{Equation (8)}$$

It can be shown that A is real, so G(s) has real coefficients. We now claim that $R(s) = G(s)G(s^{-1})$, which can be easily verified by multiplying through. We define:

$$M_{xy}(\omega) = G(s). \text{ for } s = e^{i\omega}. \quad \text{Equation (9)}$$

We claim that this $M_{xy}(\omega)$ satisfies Equation (3), and since G(s) has real coefficients, $G(s^*) = G(s)^*$. Therefore, for $|s| = 1$,

$$|M_{xy}(\omega)|^2 = G(s)G(s)^* = G(s)G(s^*) = G(s)G(s^{-1}) = R(s) = 1 - |M_z(\omega)|^2. \quad \text{Equation (10)}$$

In defining G, we could choose either A or $-A$. Thus, there are $2^{L+M+1}$ choices in defining G. $M_z(\omega)$ and $M_{xy}(\omega)$ are thus expressed as finite Fourier series and the xy magnetization after the jth pulse is defined, $M_{xy}(\omega)$, for $j=0$ and $j=N$. The next step is to find a pulse sequence which will yield that Fourier series.

One can express the effect of a pulse of f degrees around the x axis on the magnetization ($M_z$, $M_y$, $M_z$) as a matrix P(f). The effect of free precession for a time (T/(N-1)) at frequency $\omega$ can also be written as a matrix R($\omega$). Thus, the effect on the magnetization of a free precession and a pulse is (P(f).R), viewed as a matrix product.

We then apply $R^{-1}P^{-1}(f)$ to the given ($M_x$, $M_y$, $M_z$). The resultant expression is still a Fourier series. We then solve for the f that will yield a Fourier series of order N-2. We then repeat the procedure until we reduce the magnetization to a constant $M_z$ and constant $M_{xy}$. We then apply a $P^{-1}(f)$ which will yield $M_z = 1$ and $M_{xy} = 0$. The resultant series of pulses will yield, when applied in reverse to a system with $M_z = 1$ and $M_{xy} = 0$, a system with magnetization equal to the desired one.

That this part of the invention could be done was announced in an abstract published by one of the inventors entitled "An Exact Synthesis Procedure For Frequency Selective Pulses", in 5th *Proceedings of the Magnetic Resonance in Medicine*, pp. 1452-53, August, 1986. However, the details of how to obtain the pulse sequence were not given in that abstract. The technique for obtaining the pulse sequence first appeared in the aforementioned articled entitled "The Synthesis of Pulse Sequences Yielding Arbitrary Symmetric Magnetization Vectors" by the present inventors. The relevant portions of the calculations set forth in that paper for obtaining the hard pulse sequence will be reproduced here.

Having generated $M_{xy}(\omega)$, we have defined the xy magnetization after the jth pulse, $M_{xy}(\omega)_j$, for $j=0$ and $j=N$. We will develop a simple recursion relationship to allow the calculation of $M_{xy}(\omega)_{j-1}$ from $M_{xy}(\omega)_j$. That is, we will work backwards. In addition, a formula for calculating the jth pulse from $M_{xy}(\omega)_j$ will be derived. Having accomplished these two substeps, the pulse sequence will be completely defined The following matrix definitions will be used for the derivations.

$M = [m_x, m_y, m_z]^T$, with $T$ denoting the transpose, and $$R = \begin{bmatrix} \cos\Omega & -\sin\Omega & 0 \\ \sin\Omega & \cos\Omega & 0 \\ 0 & 0 & 1 \end{bmatrix} \quad P = \begin{bmatrix} 1 & 0 & 0 \\ 0 & \cos\phi & -\sin\phi \\ 0 & \sin\phi & \cos\phi \end{bmatrix}$$

where M is the magnetization vector, P·M simulates a pulse and flips the spins around the x axis, and R·M rotates the spins in the xy plane. The sequence we will use applies a rotation and then a pulse. In matrix notation this is (P·R). The initial rotation with $M = [0,0,1]$ has no effect, and the final pulse is not accompanied by a rotation since all spins are pre-rotated (that is, the operation is (P·R) not (R·P)).

Spins are neither created nor destroyed during the application of the pulse sequence. Removing the effects of (P·R) from $M_p$ will yield $M_{p-1}$. This is accomplished by multiplying by (P·R) inverse, $(P·R)^{-1}$.

$$(P \cdot R)_p^{-1} = \begin{bmatrix} \cos\Omega & \cos\phi_p\sin\Omega & \sin\phi_p\sin\Omega \\ -\sin\Omega & \cos\phi_p\cos\Omega & \sin\phi_p\cos\Omega \\ 0 & -\sin\phi_p & \cos\phi_p \end{bmatrix}$$

Hence, $$M_{p-1} = \{(P \cdot R)_p^{-1}\} M_p = \{(\cdot R)_p^{-1}\}[m_x, m_y, m_x]^5 \quad \text{Equation (11)}$$

The following derivations hinge on the fact that the only perturbations on the spin system are repeated applications of precession around the z-axis followed by a pulse around the x-axis. Rotation around the y-axis is not covered by the resulting formulae. Noting that $M_{xy} = -M + M_z$ and substituting into Equation (11) yields:

$$[M_z]_{p-1} = -\sin\phi_p[M_y]_p + \cos\phi_p[m_z]_p \text{ or} \quad \text{Equation (12)}$$
$$[M_z]_{p-1} = (1/2)\sin\phi_p[M_{xy} + M_{xy}^*]_p + [M_z]_p\cos\phi_p.$$

Similarly, $$[M_{xy}]_{p-1} = [-M_y + iM_x]_{p-1} = [M_x\sin\Omega - \quad \text{Equation (13)}$$
$M_y\cos\phi\cos\Omega -$
$M_x\sin\phi\cos\Omega + iM_x\cos\Omega + iM_y\cos\phi\sin\Omega +$
$iM_z\sin\phi\sin\Omega]_p =$
$[M_x]_p(i\cos\Omega + \sin\Omega) + [M_y]_p\cos\phi(-\cos\Omega + i\sin\Omega) +$
$[M_z]_p\sin\phi(-\cos\Omega + i\sin\Omega) = [M_x]_p(ie^{i\Omega}) +$
$(M_y)_p\cos\phi(-e^{-i\Omega}) + [M_z]_p\sin\phi(-e^{i\Omega}) =$
$[M_z]_p\sin\phi(-e^{-i\Omega}) = [M_z]_p\sin\phi(-e^{-i\Omega}) +$
$(1/2)e^{-i\Omega}\{([M_{xy}]_p + [M_{xy}^*]_p)\cos\phi + ([M_{xy}]_p$
$- [M_{xy}^*]_p)\}.$ -continued Thus,
$[M_{xy}]_{p-1} = (1/2)(1 + \cos\phi_p)e^{-i\Omega}[M_{xy}]_p - (1/2)(1 - \cos\phi_p)e^{-i\Omega}[M_{xy}^*]_p - \sin(\phi_p)e^{-i\Omega}[M_z]_p.$ Numerically, we have $[M_z]_N$ and $[M_{xy}]_n$ as Fourier coefficients. We therefore need to convert Equations (12) and (13) into equivalent form. This can be accomplished by equating terms of equal order. Let $a_r$ represent the rth Fourier coefficient for $M_z$ which corresponds to $e^{ir\omega}$ and let $f_r$ correspond to the rth Fourier coefficient for $M_{xy}$. We note that since:

$M_z(\Omega) = M_z(-\Omega)$ and $a_r = a_{-r}$, that:     Equation (14)
$[a_r]_{p-1} = (1/2)\sin\phi_p([f_r]_p + [f_{-r}]_p) + \cos\phi_p[a_r]_p$ For a sequence of N pulses, the Fourier coefficients range from $-(N-1)$ to $(N-1)$. That is, $[f_r]_p = 0$ for $0$ for $|r| \geq p$. We now set $r=(p-1)$ in Equation (14) and get $[a_{p-1}9 = 0 = \sin\phi_p([f_{p-1}]_p + [f-1]_p + \cos\phi_p [a_{p-1}]_p$. Rearranging yields:

$\tan\phi_p = -[a_{p-1}]_p/([f_{p-1}]_p + f_{-(-1)}]_p)$. Equation (16)

Setting $r=-p$ in Equation (15) yields $[f_{-p}]_{p-1} = 0 = (\frac{1}{2})(1+\cos\phi_p)[f_{-p+1}]_p = (\frac{1}{2})(1-\cos\phi_p)[f_{+a}]_p - \sin\phi_p(a_{-p+1})_p$.

Since we know that $a_r = a_{-r}$, it can be shown that $[f_{p-1}]_p$ and $[f_{1-p}]_p$ are of opposite sign. Therefore, we can define:

$\cos\phi_p = ([f_{p-1}]_p + [f_{1(-1)}]_p)/([f_{p-1}]$ Substituting into Equation (16) we obtain the last of the recursion values:

The synthesis of the pulse sequence is completed by using the $M_z$ Fourier coefficients, $[r,]x$, where $M_z(\Omega)$ is generated using a digital fast Fourier transform and from the $M_{xy}$ Fourier coefficients, and by using $[f_4,]_N$ from the generation of $M_{xy}(\Omega)$ to calculate the leading flip angles cos and sin $\phi_n$ from Equations (17) and (18) with $p = N$. We then decrease p, the current pulse, which started at N, and calculate [a], [f], cos, and sin for $p = N-1, \ldots, 2$. We can then calculate the first pulse by calculating the net angle required at $M_z(=0)$ and the sum of all angles calculated in the previous two steps, i.e., if $M,(=0) = 0$, and the sum of the $\phi_p$'s for $p=2,N$ was $\pi/3$, then the first pulse angle should be $-\pi/3$.

The inventors have also generalized the procedure of the invention to cases where $M_z$ was specified as a complex Fourier series. In such a case, the above procedure could be repeated. However, the phase retrieval problem is more complicated, and the coefficients of $M_{xy}$ will in general be complex. One may then repeat the above inversion procedure. However, then a pulse is specified not only by the number of degrees it rotates, but also by the phase of the pulse in the xy plane. A solution of the inverse problem was published by the present inventors in an article entitled "The Synthesis of Pulse Sequences Yielding Arbitrary Magnetization Vectors", *Journal of Magnetic Resonance in Medicine*, Vol. 12, pp 74-80 (1989), the contents of which are hereby incorporated by reference. Hence, the present invention may be easily extended to cases where the magnetization does not correspond to a fixed axis.

The above method is significantly different than others in that it is not iterative but rather directly calculates the pulses. Since this technique is based on the Fourier series approach, it allows employment of significant mathematical and physical intuition to understand the system's response to a hard pulse sequence As noted above, the inventors have realized that $2^{N+1}$ different pulse sequences are all generated for the same $M_z(\Omega)$ and different phases for $M_{xy}(\Omega)$. The technique is easily implementable on a computer which allows for easy generation of complicated pulse sequences required in many fields of NMR. Since the z-magnetization must be specified by a finite Fourier cosine series to generate the pulse sequence, it is highly desirable to create the pulse sequences in an optimal fashion. "Optimal," as used herein, means that the pulse sequence will have the smallest possible error in approximating the ideal pulse of FIG. 1. The inventors also realized that the best way to express $M_z$ as a finite Fourier cosine series is to apply the analogous theory from digital filter design for designing finite impulse response filters, as described, for example, by A.V. Oppenheim & R.W. Schaefer in *Digital Signal Processing*. pp. 237-267, Prentice Hall New Jersey, 1975.

Finite impulse response filters are filters which, when given an input, output a signal that dies out after a finite period of time. The output depends only on the input and not on previous values of the signal. The frequency response of such a filter is expressed as a finite Fourier cosine series. In a preferred embodiment, it is desired to utilize a finite impulse response filter that is on during one range (i.e., passing a signal during one frequency range) and off on other ranges (i.e., blocking all signals during other frequency ranges). Similarly, these filters may specify more than two ranges or other values for passing or not passing. In NMR applications, a pulse or pulse sequence must generate a specific value for $M_z$ on certain ranges and another value for $M_z$ on different ranges. Thus, finite impulse response filters lend themselves well to hard pulse sequence generation. However, it was never previously recognized by any of those skilled in the art that finite impulse response filters could be utilized in NMR until the inventors discovered finite impulse response filter theory was applicable.

In standard finite impulse response filter theory, several parameters to describe the resultant filter must be specified. These include the order of the filter N, the length of the band pass, the length of the stop band and the maximal errors on the pass band and stop band. Errors on the pass band and stop bands occur since a finite nonconstant Fourier cosine series cannot be exactly 1 over an entire range. However, it is possible to generate a Fourier cosine series which minimizes the maximal errors on the pass band and stop band when one specifies the ratio of maximal errors allowed.

It is desired to synthesize an N-pulse sequence lasting for a total time T so that the pulse sequence inverts off resonance frequencies from $-P$ to $+P$ $H_z$ and is a 0 pulse for frequencies $>S$ or $<-S$ $H_z$. This translates to designing a Fourier cosine series, F, in $\Omega 2\pi fT/N$ so that F is $-1$ between 0 and $2\pi PT/N$, and 1 between $2xST/N$ and $\pi$. Synthesizing a filter with these pass and stop bands, allowing the error to be equal on both bands and normalizing the filter's response to $-1$ and 1 instead of 1 and 0 is desired. Normalization is necessary since the absolute value of the filter's response is never $<1$. The result is a pulse sequence that is optimal since it has the least possible maximal error on the desired ranges.

The next part of the method of the invention is the appropriate specification of $M_z$ as a finite Fourier series.

As just noted, it has been realized by the inventors that the problem is similar to a problem in digital filter design, namely, the design of finite impulse response filters. This problem was mostly solved in the early 1970's by a variety of techniques. The most commonly used technique is called the Parks and McClellan algorithm There, one specifies the degree of the cosine series, the ranges from 0. to 0.5 over which one wishes to specify the values, the values one desires, and the relative importance of being accurate over each of the ranges. One can then construct a cosine series which is guaranteed to be optimal in the sense of least maximal deviation from the desired values.

The inventors thus realized that the specification of a desired $M_z$ as a Fourier series was entirely equivalent to the design of an appropriate finite impulse response filter, and the appropriate techniques developed for those filters were thus adapted by the present inventors to pulse design. In other words, to create a desired hard pulse sequence, one specifies the desired z magnetization, the number of pulses, and the duration of the pulse sequence. Using the machinery described above, one then views $M_z$ as a Fourier series in $\Omega = \omega T/(N-1)$ and then uses a finite impulse response filter design technique to obtain a Fourier series which specifies $M_z$ as having certain desired values over certain specified ranges. One then normalizes the Fourier series obtained for $M_z$ so it is always $\leq 1$ in absolute value and then one uses the machinery used above to synthesize a consistent $M_{xy}$ and a pulse sequence to actually generate that magnetization, $B_1$. A description of this aspect of the invention was published by the present inventors in abstract form in August 1988 and later fully described in a paper entitled "The Use Of Finite Impulse Response Filters in Pulse Design", *Journal of Magnetic Resonance in Medicine*, Vol. 12, pp. 81-87 (1989), the contents of which are hereby incorporated by reference.

This technique can be used in a number of NMR applications. The inventors have determined that in solvent suppression (spectroscopy), the ratio of the errors can be specified, for example, between 1:10 and 1:20. Thus, the error is minimal over the desired range. Other applications include multiple slice selection where several pass and stop ranges are specified The use of finite impulse response filters thus enables synthesis of hard pulse sequences which have close to optimal frequency responses.

Hard pulse sequences have many drawbacks, such as the existence of side lobes. Furthermore, if a large frequency must be excited by a hard pulse, a very intense external magnetic field is necessary Thus, the inventors recognized that a soft pulse approximated by a series of hard pulses would be desirable. In such soft pulses, the flip angles of the hard pulse sequence are derived from the amplitudes of the soft pulse. Over a large frequency range, only a few hard pulses are necessary to approximate a simple soft pulse. That soft pulses may be approximated by a few hard pulses was proven by the present inventors in an article entitled "*Frequency Response of Soft Pulses*", Journal of Magnetic Resonance, Vol. 75, pp. 502-505 (1987).

The inventors further showed in that article that the frequency response of every soft pulse could be uniformly approximated on every bounded frequency range by hard pulse sequences. Namely, given a soft pulse lasting for time T, for a given N the jth pulse of an N hard pulse sequence lasting for time T may be constructed as follows.

Look at the effect of the part of a given soft pulse U(t) occurring between time $(j-1)T/(N)$ and $(jT/(N))$ on the spins which are at 0 frequency and are pointing up. The N hard pulses rotate the spins of the system and will correspond to a rotation around an axis in the xy plane of f degrees. If the jth pulse is a hard pulse corresponding to a rotation around the axis in the xy plane of f degrees, followed by free precession for time $T/(N-1)$, then as N becomes large, the effect of the hard pulse sequence uniformly approximates the effect of the soft pulse sequence on the spins of the system for every bounded frequency range. This occurs since U(t) can be approximated by a series of step functions, where each step function is merely a sequence of consecutive rectangular pulses. By taking the limit of the step function as N approaches infinity and using standard arguments from integration theory, the sequence of N hard pulses approximates the soft pulse, U(t). Details of this technique can be found in an abstract published by the present inventors in August, 1988 and in further detail in an article entitled "The Synthesis of Soft Pulses With a Specified Frequency Response", *Journal of Magnetic Resonance in Medicine*, Vol. 12, pp. 88-92 (1989), the contents of which are hereby incorporated by reference. As described therein, since the convergence is fairly rapid, one does not need a large N to achieve a good approximation.

The inventors have further realized that one could try to reverse the procedure by constructing the soft pulse from a given hard pulse sequence. That is, given an N pulse hard pulse sequence lasting for time T, one could construct a soft pulse sequence lasting for $T*(N/(N-1))$. The soft pulse would have N segments, each lasting for time $T/(N-1)$. During each segment, one gives a constant B field which has the effect of rotating the 0 frequency spins the same amount as the hard pulses did.

If the flip angles of the hard pulses are relatively small, the frequency responses of the hard pulse sequence and the soft pulse sequence, over a limited frequency range, are similar. However, one problem is that a hard pulse sequence is known to have sidelobes. That is, if one gives an N hard pulse sequence for time T, the frequency response of $\omega$ is the same as at $\omega + (1/t)$, due to the periodic nature of Fourier series. Soft pulses in general do not have this periodicity. Thus, if the hard pulse flip angles are not sufficiently small, one ends up with partial excitation at $\omega + (1/t)$, which in general is undesirable.

Accordingly, the inventors showed that if an N hard pulse sequence can be designed with the desired frequency characteristics with N large, then if one could choose such a sequence with small flip angles, one should be able to construct a soft pulse with a similar frequency response to the hard pulse. The idea of choosing a hard pulse shape and then converting it to a soft pulse is not believed to be shown or suggested in the prior art.

To implement the technique, one has to choose one of the many hard pulse sequences generated by the technique. This corresponds to choosing one of the solutions of the phase retrieval problem. It has been shown that choosing the roots of $(1+m,)/2$ to be all inside the unit circle (as in the minimal phase solution) or choosing most of them inside the unit circle yields small flip angles and a good soft pulse approximation. Furthermore, the inventors have shown that if one interpolates, so that instead of starting with a 40 hard pulse sequence and getting a 40 segment soft pulse, one gets a 400 soft pulse sequence, one significantly improves the soft pulse. Furthermore, one eliminates the side lobes discussed above. This technique has been described in the aforementioned article entitled "The Synthesis of Soft Pulses With a Specified Frequency Response".

By way of example, a soft pulse sequence with a similar frequency response may be formed from a hard pulse sequence as follows. A hard pulse sequence with a large number of pulses N is chosen. Preferably N is between 20 and 40, although N may be larger. As described above, $2^N$ different pulse sequences are possible, but one pulse sequence is chosen which has relatively small flip angles. The roots of $1-M_z^2$ are then solved. As noted above, if $s_j$ is a root, then $S_j^{-1*}$ is also a root. Choosing $S_j$, or the conjugate inverse, $M_{xy}$ can be constructed. This leads to many potential choices of $M_{xy}$, up to $2^{2N}$, and it is impractical to search all of them. Therefore, a reasonable criteria to select the roots in order to end up with a pulse sequence which has a small number of pulses is desired. Theoretical considerations of the nature of the magnetization response to a hard pulse sequence whose pulses are small allows for root selection.

Factoring $1-M_z^2$ into $(1-M_z)(1+M_z)$ it is possible to solve for the roots of each polynomial separately. Symmetry conditions for the roots of $1-M_z^2$ are also satisfied by the roots of each factor polynomial. It is then desired to look at the roots which lie outside the unit circle. These roots are ordered by the size of each polynomial. Each polynomial has up to N roots outside the unit circle.

Preferably a number L which is less than or equal to N is chosen. Then, the first L roots of $1-M_z$ are all selected to be either inside or outside the unit circle. It is then desired to choose one root inside and the next root outside the unit circle For the second plynomial, K roots are chosen inside or outside the unit circle and then one root inside and one root outside the unit circle are chosen. This leads to at most $4N^2$ pulse sequences. Restricting the choice of the first K roots to be outside of the unit circle for the first polynomial and for the second polynomial choosing only inside roots, the same results are attained. This limits the search to 4N pulse sequences. It is then desired to choose the pulse sequence with the smallest maximal angle.

To construct the soft pulse from the hard pulse sequence it is necessary to divide the time interval T into (N+1) equal segments. For the jth segment, a rectangular soft pulse which rotates the resonance spins the same amount as the jth hard pulse is given. If the pulse angles are reasonably small, the frequency response of the soft pulses is very close to the frequency response of the hard pulse. If the pulse angles are all less than 50 this construction works well. The inventors have found that this construction is useful for pulse angles up to 90°. If the pulses are too big, it is necessary to increase N, the number of pulses in the hard pulse sequence, and start the process again.

A soft pulse so constructed has many of the disadvantages of the hard pulse sequence. The major problem it displays is the existence of side lobes. A hard pulse sequence excites all frequencies with a periodicity of N/T. The soft pulse constructed with the above method excites the first two lobes in addition to the desired area. However, this can be eliminated by using interpolation. Interpolation smoothes the soft pulse profile and eliminates side lobes. The inventors have shown that by using a variant of a quartic spline to smooth the soft pulse, side lobes are eliminated. Other interpolation methods are also useable.

The inventors have realized startlingly unexpected results by utilizing their new method for pulse synthesis. FIG. 2 is a graph of z-magnetization against the frequency in Hz wherein the Silver et al. pulse, a hyperbolic secant pulse, and a pulse derived from the inventors' methods are compared. The Silver et al. pulse was developed using the techniques in the aforementioned Silver et al. paper and, as shown at 2, the resulting pulse is less accurate than one formed using the method of the invention As shown, as the pulse nears the upper and lower end of the desired frequency range the frequency response near the edges of the specified inversion range is substantially less accurate.

Figure 3:
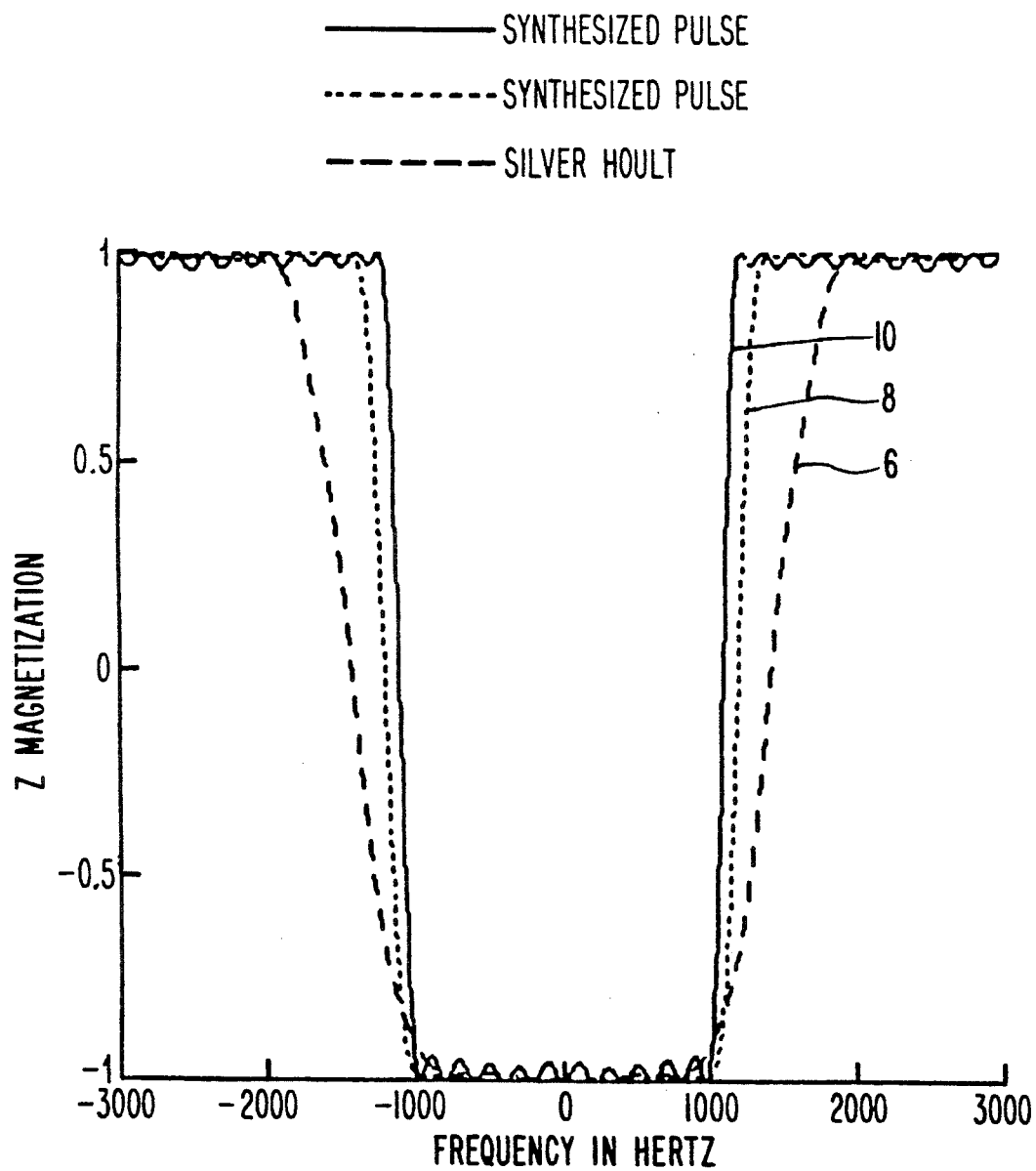
FIG. 3 graphically illustrates two soft pulses derived in accordance with the methods of the invention using different initial specifications of the desired frequency response compared with the Silver et al. pulse.

FIG. 3 is a comparison of two synthesized soft pulses with the Silver et al. pulse. Synthesized pulse 8 has a sharper transition than the Silver et al. pulse. It is also less sharp in its transition than synthesized pulse 10, which has a sharper transition than either pulse 8 or the Silver et al. pulse. However, synthesized pulse 10 has a larger maximal error in the center of the frequency range. This is an example of the trade offs which are possible with these new methods since with these methods it is possible to specify whether the synthesized pulse should have a sharp transition or less error.

There has been described certain embodiments of the invention herein disclosed which provide methods of pulse generation for optimally exciting specified frequency bands. While preferred embodiments have been shown and described, modifications are within the spirit and scope of the invention and will be recognized by those with ordinary skill in the art.

For example, for some applications, one wishes to specify not only the final z-magnetization, but also the rotation operator. For example, in imaging, one may wish to specify a pulse that rotates 180° about an axis in the xy plane, like an inversion pulse. Furthermore, one may wish to specify that all frequencies get rotated about the same axis. As noted above, this type of pulse is known as a refocusing pulse. Therefore, looking at the pulse as an operator on the magnetization, one would like to specify the components of this operator. The present invention may be extended to this area as well using spinors Such an extension using spinors has been described by the present inventors in an abstract in August 1988 and later in more detail in a paper entitled "The Application of Spinors to Pulse Synthesis and Analysis", *Journal of Maqnetic Resonance in Medicine*, Vol. 12, pp. 93-98 (1989), the contents of which are hereby incorporated by reference.

In addition, the present inventors have recognized that the methods of the invention may be similarly applied to optical systems, such as laser systems, where a desired optical excitation is to be created from a series of input "hard" pulses or a particular "soft" pulse. In other words, the input pulses may be used to selectively excite the laser. The technique of the invention thus may be readily adapted for use in such systems.

Accordingly, all such modifications are intended to be included within the scope of the invention as defined by the following claims.

What is claimed:

1. A method of generating a desired physically realizable, frequency dependent excitation of a system, comprising the steps of:

(a) determining, as a function of frequency, an approximation to the desired frequency dependent excitation;
(b) synthesizing a hard pulse sequence of N pulses which generates said approximation; and
(c) applying the hard pulse sequence of N pulses determined in step (b) to said system.

2. The method of claim 1, wherein said system is a nuclear magnetic resonance imaging system and said hard pulse sequence of N pulses is used to form an imaging slice for display.

3. The method of claim 1, wherein said system is a spectroscopy system and said hard pulse sequence of N pulses is used to select a solvent frequency.

4. The method of claim 1, wherein said system is an optics system and said hard pulse sequence of N pulses is used to selectively excite a laser.

5. The method of claim 2, wherein said desired frequency dependent excitation is a magnetization applied to said system when said system is in an external magnetic field.

6. The method of claim 2, wherein said desired frequency dependent excitation includes a rotation operator applied to said system when said system is in an external magnetic field and the resulting synthesized hard pulse sequence of N pulses is used to refocus said imaging slice for display.

7. A method of generating a desired physically realizable, frequency dependent excitation of a system, comprising the steps of:
(a) determining, as a function of frequency $\omega$, an approximation to a desired physically realizable magnetization $M_z$ in a direction z parallel to an external magnetic field B for the desired frequency dependent excitation of said system;
(b) determining from $M_z(\Omega)$, as a function of frequency an approximation to a desired physically realizable magnetization $M_{xy}$ in a plane xy perpendicular to said external magnetic field B;
(c) synthesizing a hard pulse sequence of N pulses which generates $M_{xy}(\Omega)$ and $M_{xy}(\Omega)$; and
(d) applying the hard pulse sequence of N pulses determined in step (c) to said system in said plane xy.

8. The method of claim 7, wherein said approximation to $M_z(\Omega)$ is an N+1 term cosine Fourier series:

$$M_z(\Omega) = \sum_{j=0}^{N} a_j \cos(j\Omega)$$

and said approximation to $M_{xy}(\Omega)$ is determined from the relationship:

$$|M_z(\Omega)|^2 + |M_{xy}(\Omega)|^2 = |M_0|^2,$$

where $M_0$ is a constant magnitude of a magnetization vector formed when said hard pulse sequence of N pulses is applied to said system.

9. The method of claim 8, wherein the hard pulse sequence of N pulses is synthesized in step (c) by calculating a jth pulse from $M_{xy}(\Omega)$ for j=0 through N and determining a recursive relationship which allows the calculation of $M_{xy}(\Omega)_{j-1}$ from $M_{xy}(\Omega)$ for j=0 through N.

10. The method of claim 8, wherein the hard pulse sequence of N pulses is synthesized in step (c) by:
(c1) calculating, using Fourier coefficients $a_j$ of $M_z(\Omega)$ and $f_j$ of $M_{xy}(\Omega)$, flip angles $\cos \theta_j$ and $\sin \theta_j$ for j =N, where $\theta$ a flip angle defined relative to an axis in the plane xy;
(c2) calculating $a_j$, $f_j$, $\cos \theta_j$ and $\sin \theta_j$ for j =N−1 in reverse order down to j =2; and
(c3) calculating a first pulse of said hard pulse sequence of N pulses as a difference between a flip angle required at $M_z(\Omega=0)$ and a sum of all flip angles calculated in steps (c1) and (c2).

11. The method of claim 10, wherein each pulse of said hard pulse sequence has a delay of a duration $\tau$ followed by a frequency dependent pulse around said axis in the plane xy of angle $\theta$, thereby approximately constantly spacing each pulse of said hard pulse sequence.

12. The method of claim 8, wherein the N+1 term cosine Fourier series $M_z(\Omega)$ is generated by specifying the desired frequency dependent excitation as a plurality of finite impulse response filters having N outputs.

13. The method of claim 7, comprising the further steps of synthesizing a soft pulse which causes a frequency response of said system substantially corresponding to the frequency response of said system occurring when said hard pulse sequence of N pulses synthesized in step (c) is applied to said system, and applying said soft pulse in step (d) in place of said hard pulse sequence of N pulses synthesized in step (c).

14. The method of claim 13, comprising the further step of interpolating said soft pulse prior to application to said system, thereby eliminating side lobes of said soft pulse and smoothing a curve profile of said soft pulse.

15. A method of generating a desired physically realizable, frequency dependent excitation of a system, comprising the steps of:
(a) synthesizing a hard pulse sequence of N pulses which causes a frequency dependent excitation of said system which closely approximates said desired frequency dependent excitation of said system;
(b) synthesizing from said hard pulse sequence of N pulses a soft pulse which causes a frequency dependent excitation of said system substantially corresponding to the frequency dependent excitation of said system when said hard pulse sequence of N pulses is applied; and
(c) applying the soft pulse synthesized in step (b) to said system.

16. The method of claim 15, wherein step (a) comprises the further steps of:
(a1) determining, as a function of frequency $\Omega$ an approximation to a desired physically realizable magnetization $M_z$ in a direction z parallel to an external magnetic field B for the desired frequency dependent excitation of said system;
(a2) determining from $M_z(\Omega)$, as a function of frequency an approximation to a desired physically realizable magnetization $M_{xy}$ in a plane xy perpendicular to said external magnetic field B; and
(a3) synthesizing a hard pulse sequence of N pulses which generates $M_{xy}(\Omega)$ and $M_z(\Omega)$.

17. The method of claim 16, wherein said approximation to $M_z(\Omega)$ is an N+1 term cosine Fourier series:

$$M_z(\Omega) = \sum_{j=0}^{N} a_j \cos(j\Omega)$$

and said approximation to $M_{xy}(\Omega)$ is determined from the relationship:

$$|M_z(\Omega)|^2 + |M_{xy}(\Omega)|^2 = |M_0|^2.$$

where $M_0$ is a constant magnitude of a magnetization vector formed when said hard pulse sequence of N pulses is applied to said system.

18. The method of claim 17, wherein the hard pulse sequence of N pulses is synthesized in step (a3) by calculating a jth pulse from $M_{xy}(\Omega)_j$ for $j = 0$ through N and determining a recursive relationship which allows the calculation of $M_{xy}(\Omega)j-1$ from $M_{xy}(\Omega)$ for $j = 0$ through N.

19. The method of claim 17, wherein the hard pulse sequence of N pulses is synthesized in step (a3) by:
   (a3a) calculating, using Fourier coefficients $a_j$ of $M_z(\Omega)$ and $f_j$ of $M_{xy}(\Omega)$, flip angles $\cos \theta_j$ and $\sin \theta_j$ for $j = N$, where $\theta$ a flip angle defined relative to an axis in the plane xy;
   (a3b) calculating $a_j$, $f_j$, $\cos \theta_j$ and $\sin \theta_j$ for $j = N-1$ in reverse order down to $j = 2$; and
   (a3c) calculating a first pulse of said hard pulse sequence of N pulses as a difference between a flip angle steps (a3a) and (a3b).

20. The method of claim 19, wherein each pulse of said hard pulse sequence has a delay of a duration $\tau$ followed by a frequency dependent pulse around said axis in the plane xy of angle $\theta$, thereby approximately constantly spacing each pulse of said hard pulse sequence.

21. The method of claim 17, wherein the N+1 term cosine Fourier series $M_z(\Omega)$ is generated by specifying the desired frequency dependent excitation as a plurality of finite impulse response filters having N outputs.

22. The method of claim 16, comprising the further step of interpolating said soft pulse prior to application to said system, thereby eliminating side lobes of said soft pulse and smoothing a curve profile of said soft pulse.

* * * * *

UNITED STATES PATENT AND TRADEMARK OFFICE
CERTIFICATE OF CORRECTION

PATENT NO. : 5,153,515
DATED : October 6, 1992
INVENTOR(S) : Leigh et al.

It is certified that error appears in the above-identified patent and that said Letters Patent is hereby corrected as shown below:

Column 1, Line 51, after "frequency" add --.--.

Column 1, Line 53, after "moment" add --.--.

Column 1, Line 60, after "unrealizable" add --.--.

Column 2, Line 66, after "ideal" add --.--.

Column 3, Line 36, after "plane" add --.--.

Column 6, Line 42, after "frequency" add --.--.

Column 7, Line 47, change "$M_z$" to --$M_x$--.

Column 7, Line 56, change "s = exp(i•T/(N-1))" to
--s = exp(iωT/(N-1))--.

Column 8, Lines 41-47, delete in their entirety and replace with --

$$R(s) = P((s+s^{-1})/2) = b_{2N} 2^{-2N} s^{-2N} \prod_{j=1}^{4N}(s-s_j) = 1-|M_z(\Omega)|^2 \quad \text{Equation (6)}$$
--.

Column 8, Line 55, delete in its entirety and replace with
--P(u)=1-$|M_z(\Omega)|^2 \geq 0$ for u=cos(ωτ), thus any root $u_j$--.

Column 8, Line 60, delete in its entirety and replace with
--j=1,M.--.

Column 8, Line 61, after "real," replace "$|h_j|$" with --$|g_j|$--.

Column 8, Line 67, after "for" replace "$M_{xy}(\omega)$" with --$M_{xy}(\Omega)$--.

UNITED STATES PATENT AND TRADEMARK OFFICE
CERTIFICATE OF CORRECTION

PATENT NO. : 5,153,515

DATED : October 6, 1992

INVENTOR(S) : Leigh et al

It is certified that error appears in the above-indentified patent and that said Letters Patent is hereby corrected as shown below:

Column 9, Line 4, after "us " replace "$2^{(L+H)}$" with --$2^{(L+H)}$--.

Column 9, Lines 5 and 7, replace "$M_{xy}(\omega)$" with --$M_{xy}(\Omega)$--.

Column 9, Lines 8-23, delete in their entirety and replace with
--

$$G(s) = As^{-N}(\prod_{j=1}^{L}(s-r_j)\prod_{j=1}^{M}(s-f_j)(s-f_j^*)) \times$$

$$(\prod_{j=1}^{K}(s-g_j)K_j \prod_{j=1}^{H}(s-h_j)(s-h_j^{-1})).$$

Equation (7)

$$\text{with } A^2 = b_{2N}2^{-2N}/(\prod_{j=1}^{L}(r_j)\prod_{j=1}^{H}(f_j f_j^*)\prod_{j=1}^{K}(h_j)K_j)$$

Equation (8)--.

Column 9, Lines 27-29, delete in their entirety and replace with
--
$$M_{xy}(\Omega)=G(s), \text{ for } s=e^{i\Omega}.$$

Equation (9)--.

Column 9, Line 30, after "this" replace "$M_{xy}(\omega)$" with --$M_{xy}(\Omega)$--.

UNITED STATES PATENT AND TRADEMARK OFFICE
CERTIFICATE OF CORRECTION

PATENT NO. : 5,153,515
DATED : October 6, 1992
INVENTOR(S) : Leigh et al

Page 3 of 7

It is certified that error appears in the above-indentified patent and that said Letters Patent is hereby corrected as shown below:

Column 9, Lines 33-35, delete in their entirety and replace with
--
$$|M_{xy}(\Omega)|^2 = G(s)G(s)^* = G(s)G(s_2^*) = G(s)G(s^{-1}) = R(s) = 1-|M_z(\Omega)|^2.$$
Equation (10)--.

Column 9, Line 40, before "for" replace "$M_{xy}(\omega)$" with --$M_{xy}(\Omega)$--.

Column 10, Line 5, after "generated" replace "$M_{xy}(\omega)$" with --$M_{xy}(\Omega)$--.

Column 10, Line 6, after "pulse," replace "$M_{xy}(\omega)_j$" with --$M_{xy}(\Omega)_j$--.

Column 10, Line 8, after "of" delete remainder of line and replace with --$M_{xy}(\Omega)_{j-1}$ from $M_{xy}(\Omega)_j$.--.

Column 10, Line 10, after "from" replace "$M_{xy}(\omega)_j$" with --$M_{xy}(\Omega)_j$--.

UNITED STATES PATENT AND TRADEMARK OFFICE
CERTIFICATE OF CORRECTION

PATENT NO. : 5,153,515
DATED : October 6, 1992
INVENTOR(S) : Leigh et al

It is certified that error appears in the above-indentified patent and that said Letters Patent is hereby corrected as shown below:

Column 10, Lines 42-44, delete in their entirety and replace with
-- $M_{p-1} = \{(P \cdot R)_p^{-1}\} M_p = \{(P \cdot R)_p^{-1}\} \{[m_x, m_y, m_z]_p^T\}$
Equation (11) --.

Column 11, Line 11, after "to" (first occurrence) replace "$e^{ir\omega}$" with --$e^{ir\phi}$--.

Column 11, Line 15, after "$\cos\phi_p [a_r]_p$" add:

--and
$$[f_r]_{p-1} = (1/2)(1+\cos\phi_p) [f_{r+1}]_p - (1/2)(1-\cos\phi_p) [f_{-(r+1)}]_p - \sin\phi_p [a_{r+1}]_p.$$
Equation (15)--.

Column 11, Line 19, delete "$[a_r]_p = 0$"

Column 11, Line 21, after "get" delete remainder of line and replace with --$[a_{p-1}]_{p-1} = 0 = \sin\phi_p ([f_{p-1}]_p + [f_{-(p-1)}]_p + \cos\phi_p$--.

Column 11, Line 24, delete entire line and replace with
-- $\tan\phi_p = -[a_{p-1}]_p / ([f_{p-1}]_p + [f_{-(p-1)}]_p).$
Equation (16)--.

Column 11, Lines 26-28, delete lines in their entirety and replace with --Setting r = -p in Equation (15) yields $[f_{-p}]_{p-1} = 0 = (1/2)(1+\cos\phi_p)[f_{-p+1}]_p - (1/2)(1-\cos\phi_p)[f_{(p+1)}]_p - \sin\phi_p [a_{-p+1}]_p.$--.

UNITED STATES PATENT AND TRADEMARK OFFICE
CERTIFICATE OF CORRECTION

PATENT NO. : 5,153,515

DATED : October 6, 1992

INVENTOR(S) : Leigh et al

Page 5 of 7

It is certified that error appears in the above-indentified patent and that said Letters Patent is hereby corrected as shown below:

Column 11, Lines 32-34, delete lines in their entirety and replace with

-- $$\cos\phi_p = ([f_{p-1}]_p + [f_{-(p-1)}]_p) / ([f_{p-1}]_p - [f_{-(p-1)}]_p) \cdot \quad \text{Equation (17)}$$

Substituting into Equation (16) we obtain the last of the recursion values:

$$\sin\phi_p = -[a_{p-1}]_p / ([f_{p-1}]_p - [f_{-(p-1)}]_p) \cdot \quad \text{Equation (18)} --.$$

Column 11, Line 36, after "coefficients," replace "$[_r,]x,$" with --$[a_r]_N,$--.

Column 11, Line 40, change "cos" to --$\cos\phi_n$--.

Column 11, Line 42, after "calculate" change "[a], [f], cos, and sin" to --$[a]_p, [f]_p, \cos\phi_p,$ and $\sin\phi_p$--.

Column 11, Line 44, after "at" change "$M_z(=0)$" to --$M_z(\Omega=0)$--.

Column 11, Line 46, after "if" change "$M,(=0) = 0,$" to

UNITED STATES PATENT AND TRADEMARK OFFICE
CERTIFICATE OF CORRECTION

PATENT NO. : 5,153,515
DATED : October 6, 1992
INVENTOR(S) : Leigh et al

It is certified that error appears in the above-indentified patent and that said Letters Patent is hereby corrected as shown below:

--$M_z(\Omega=0) = 0,$--.

Column 13, Line 28, after "always" change "$\leq 1$" to --$\leq 1$--.

Column 13, Line 51, after "necessary" add --.--.

Column 14, Line 63, after "of" change "$(1+m,)/2$" to --$(1+m_z)/2$--.

Column 15, Line 25, after "into" change "$(1-M,)(1+M_z)$ to --$(1-M_z)(1+M_z)$--.

Column 15, Line 54, after "than" replace "50" with --50°--.

Column 16, Line 13, after "invention" add --.--.

UNITED STATES PATENT AND TRADEMARK OFFICE
CERTIFICATE OF CORRECTION

PATENT NO. : 5,153,515
DATED : October 6, 1992
INVENTOR(S) : Leigh et al.

It is certified that error appears in the above-indentified patent and that said Letters Patent is hereby corrected as shown below:

Column 17, Line 31, after "frequency" change "$\omega$" to --$\Omega$--.

Column 17, Line 37, after "quency" add --$\Omega$,--.

Column 17, Line 41, after "and" (first occurrence) change "$M_{xy}(\Omega)$" to --$M_z(\Omega)$--.

Column 17, Line 63, after "from" change "$M_{xy}(\Omega)$" to --$M_{xy}(\Omega)_j$--.

Column 18, Line 56, after "quency" add --$\Omega$,--.

Column 19, Line 11, after "from" change "$M_{xy}(\Omega)$" to --$M_{xy}(\Omega)_j$--.

Signed and Sealed this

Fifteenth Day of February, 1994

Attest:

BRUCE LEHMAN

*Attesting Officer*  Commissioner of Patents and Trademarks